US009321081B2

(12) United States Patent
Whitaker

(10) Patent No.: US 9,321,081 B2

(45) Date of Patent: Apr. 26, 2016

(54) APPARATUS AND METHODS OF TUNING AND AMPLIFYING PIEZOELECTRIC SONIC AND ULTRASONIC OUTPUTS

(71) Applicant: George Whitaker, Bloomington, IN (US)

(72) Inventor: George Whitaker, Bloomington, IN (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 614 days.

(21) Appl. No.: 13/851,336

(22) Filed: Mar. 27, 2013

(65) Prior Publication Data

US 2014/0029386 A1 Jan. 30, 2014

Related U.S. Application Data

(60) Provisional application No. 61/676,569, filed on Jul. 27, 2012.

(51) Int. Cl.

| | |
|---|---|
| ***H01L 41/083*** | (2006.01) |
| ***B06B 1/06*** | (2006.01) |
| ***B06B 1/02*** | (2006.01) |

(52) U.S. Cl.

CPC ................ *B06B 1/06* (2013.01); *B06B 1/0207* (2013.01); *B06B 1/0618* (2013.01); *B06B 2201/20* (2013.01); *B06B 2201/55* (2013.01); *B06B 2201/71* (2013.01); *B06B 2201/74* (2013.01)

(58) Field of Classification Search

CPC ...................................................... H04R 17/00

USPC ................................................. 310/311–371

See application file for complete search history.

*Primary Examiner* — Thomas Dougherty

(74) *Attorney, Agent, or Firm* — Christopher A. Monsey

(57) ABSTRACT

An apparatus and method associated with amplifying piezoelectric sonic and ultrasonic outputs is presented which provides high power output from piezoelectric devices, especially at high ultrasonic frequencies, in open air, which mitigates or eliminates overheating of the piezoelectric devices when stimulated at or near their peak outputs for extended periods. In addition, the invention provides a means of amplifying a piezoelectric sonic and ultrasonic device if a desired output power exceeds a normal maximum capability of the piezoelectric device.

47 Claims, 3 Drawing Sheets

APPARATUS AND METHODS OF TUNING AND AMPLIFYING PIEZOELECTRIC SONIC AND ULTRASONIC OUTPUTS

CROSS-REFERENCE TO RELATED APPLICATIONS

The present application claims priority to U.S. Provisional Patent Application Ser. No. 61/676,569, filed Jul. 27, 2012, entitled "APPARATUS AND METHODS OF TUNING AND AMPLIFYING PIEZOELECTRIC SONIC AND ULTRASONIC OUTPUTS", the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon.

BACKGROUND AND SUMMARY OF THE INVENTION

The present invention relates to amplifying and tuning piezoelectric sonic and ultrasonic while dealing with heat dissipation and focusing the energy at a desired location and/or direction. For example, the invention relates to increasing the energy directed at a desired location from piezoelectric devices when operated in open air.

One aspect of the invention is directed towards addressing transfer of energy in open air, from piezoelectric devices, in a desired direction and/or to a desired location has several limitations. These limitations include; lack of heat dissipation, inherent power capability of the devise and directional control especially when multiple devices are used. Due to these limitations, open air applications are severally limited in many areas where otherwise the efficiency of piezoelectric devices could provide many benefits. Listed below are some of these areas that this invention will facilitate: Ultrasonic cleaning; currently ultrasonic cleaning is accomplished in a liquid medium because the liquid transfers the energy much more efficiently than open air and the liquid also acts as a heat sink to dissipate the thermal energy. With this invention thermal cleaning can be accomplished in open air. Long distance echo location such as sonar: currently long distance echo location such as sonar can only be efficiently accomplished in a liquid medium such as water. With this invention, the energy directed at a target in open air can be increased to allow echo location at far greater distances; deterrent to human or animal encroachment: currently the use of sonic or ultrasonic as a deterrent to encroachment is limited by the amount of energy directed at the target. This invention increases the amount of energy directed at a target when using piezoelectric devices.

One aspect of the invention increases the amount of energy transmitted to a target and/or in a given direction, produced by piezoelectric devices. This aspect of the invention resolves several problems with increasing the amount of energy produced by piezoelectric devices. By sandwiching the piezoelectric devices between metal plates the problem of heat dissipation is resolved. By sizing the metal plates such that the plates have a resonance at the desired frequency of the device, the amount of energy transmitted is increased and more efficiently radiates the heat produced. By stacking the sandwiched devices as shown in FIG. 1 and phasing the outputs of each devise to be in phase with the front plate such that all wavefronts are additive at the front surface of the forward plate, the energy is focused in a desired direction. By adding parabolic curvature of each plate and increasing the radius of each plate as it gets further from the front while changing its thickness to maintain its resonance, improved intensity and focus is achieved.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which.

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

Figure 1:
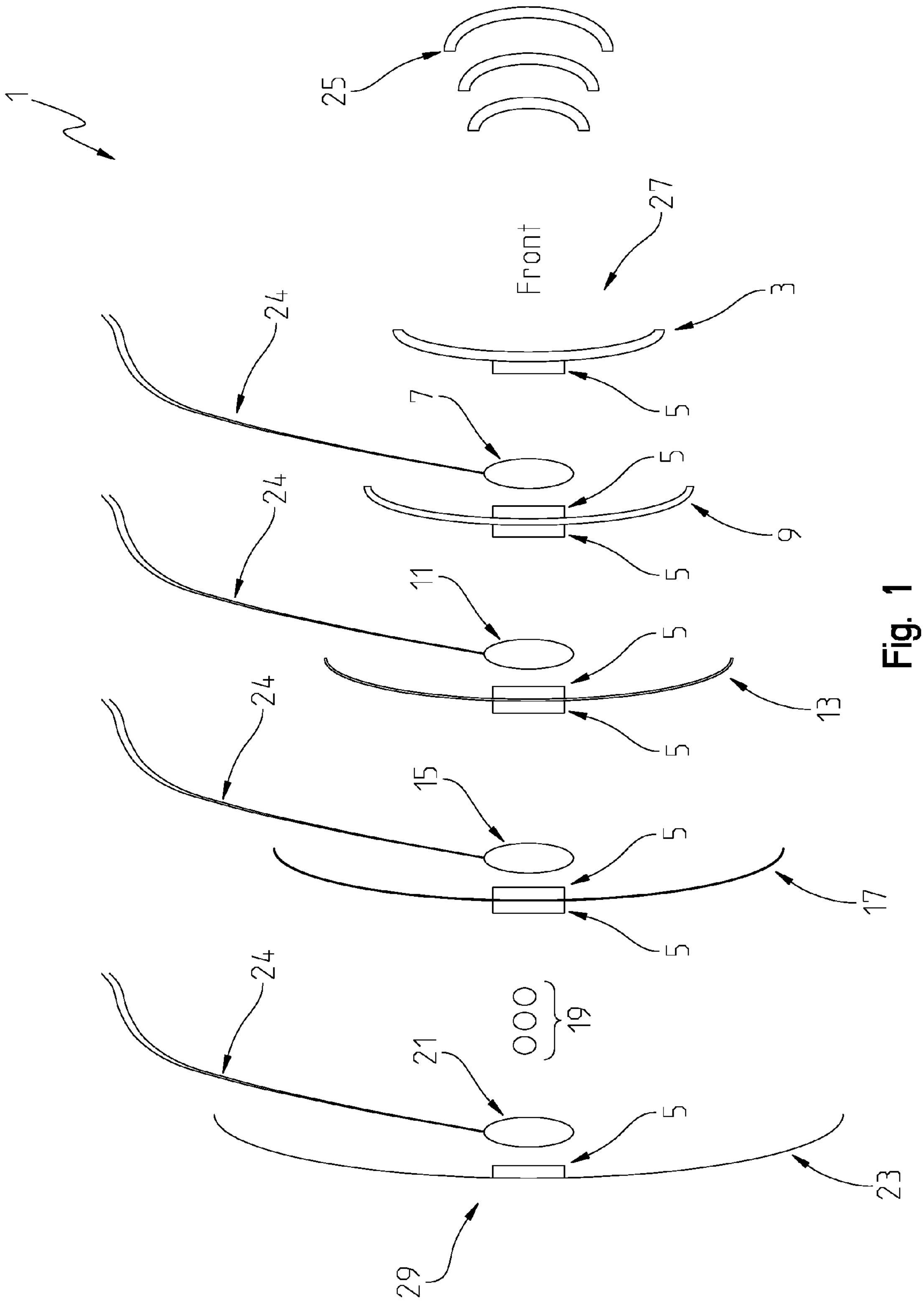
FIG. 1 shows an exemplary diagram of an assembly made up of stacked piezoelectric devises coupled between heat conductive plates.

Referring initially to FIG. 1, illustrates an assembly 1 notionally representative of one aspect or embodiment of the invention. Piezoelectric devices 7, 11, 15, 19, 21 operate at a desired frequency of the assembly 1. Electrical leads 24 are coupled to the piezoelectric devices 7, 11, 15, 19, 21 to provide control signals and power to these devices. These leads are coupled to one or more controllers (not shown but see FIG. 3) which operate the piezoelectric devices. The assembly 1 is manufactured to provide good thermal conductivity and sonic conductivity between itself and the bonded plate on a front face 27. Thermally and ultrasonically conductive plates 3, 9, 13, 17, 23 are provided to serve several functions, including a heat sink function, for insertion into the assembly where each plate is inserted between two piezoelectric devices 7, 11, 15, 19, 21. Thermally and sonically/ultrasonically conductive adhesive or bonding material is provided to couple the plates 3, 9, 13, 17, 23 to their corresponding piezoelectric devices 7, 11, 15, 19, 21. In other words, one thermally and sonically conductive plate is respectively disposed between each of the piezoelectric devices 7, 11, 15, 19, 21. A rear face 29 of the assembly 1 can be sonically insulated such that it reduces exciting the plate bonded to its back side (not shown) because the back side plate 23 is excited by the next piezoelectric or sonic/ultrasonic device behind it which is phased differently. Phasing can be accomplished off assembly and can further be static, dynamic open or closed loop depending on the application and need.

One aspect of the invention provides a directional transmission of sonic energy 25 that depending on the application can be focused at infinity, to a point forward of the assembly, or in a fan beam forward of the assembly depending on the shape of the heat conductive plates (e.g., metal plates). In the example provided herein, round plates are used with parabolic contours (not shown) of increasing diameter (e.g., see FIG. 2) to provide focus, however several variations can be implemented. One variation for plates 3, 9, 13, 17, 23 used in the assembly 1 is to use oval plate shapes to provide two resonant frequencies with the same device or other shapes (e.g., complex) to provide multiple resonances. Another variation is to use flat plates to provide directional transmission without focus. Another variation is to use structures or materials which alter the shape or size of such heat conductive plates in order to tune energy output and alter waveforms produced from single and multiple piezoelectric devices.

Figure 2:
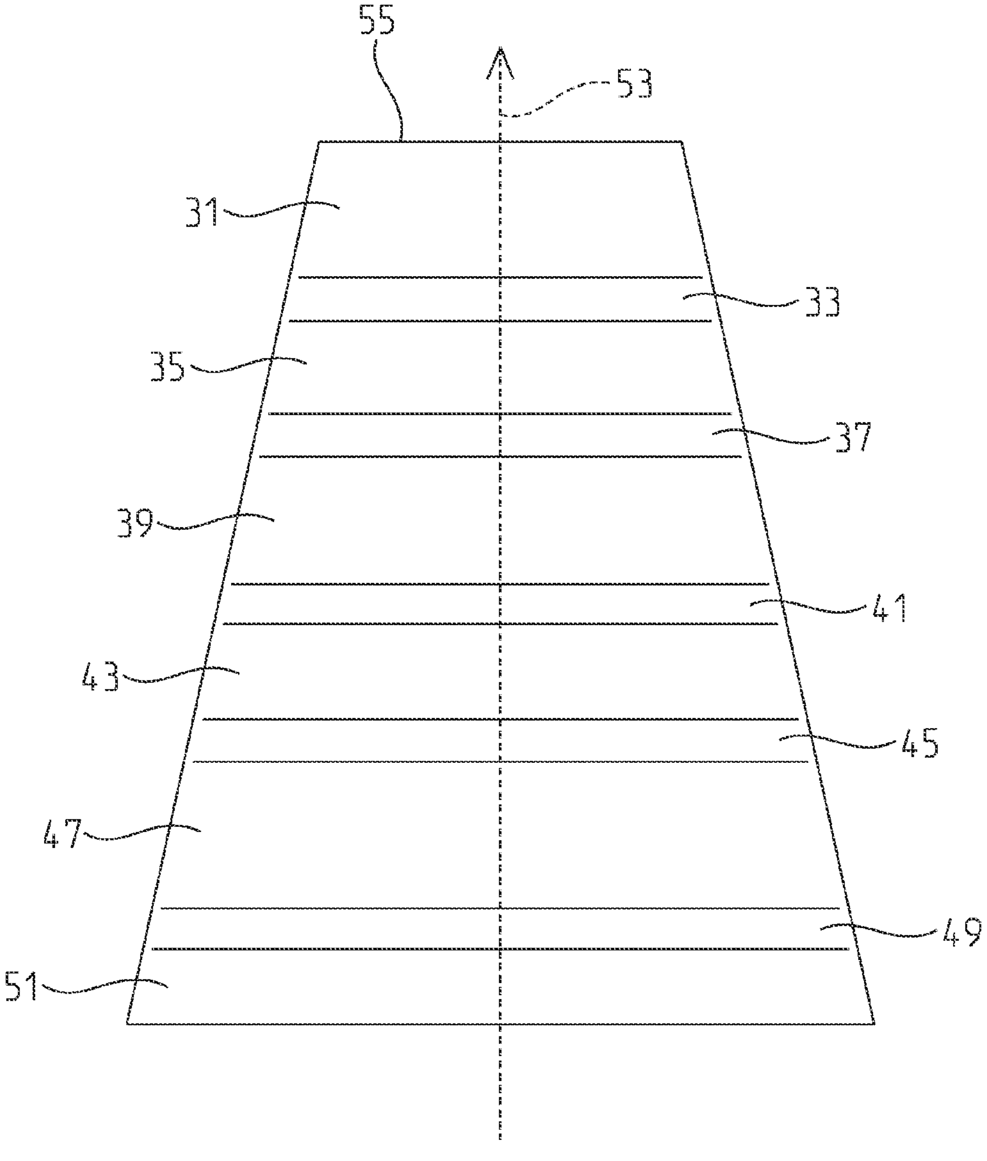
FIG. 2 shows an exemplary diagram of an assembly made up of stacked piezoelectric devices having heat conductive plates coupled between the devices according to an embodiment of the invention.

FIG. 2 shows an assembly formed with thermal and sonically/ultrasonically conductive plates 31, 35, 39, 43, 47, 51 which have increasing plate radius of each plate as a given plate is positioned further from a front section 55 along a propagation path 53 while changing each plate's respective thickness to maintain its resonance, provide improved intensity and focus at a predetermined point which also reduces need for higher power systems. Each of plates 31, 35, 39, 43, 47, 51 is formed with a parabolic curvature (not shown) that is adapted to focus waveforms of sonic or ultrasonic waves passing through the plates. A piezoelectric device 33, 37, 41, 45, 49 is positioned respectively between each of the plates 31, 35, 39, 43, 47, 51. Some embodiments can further include structural support braces which ensure plates and devices are aligned. An acoustic absorber is positioned at an opposing side of the assembly from where a propagation path 53 exits the assembly. Each plate (e.g., resonator plate), is tuned by its shape and material selection to frequency F in Hertz. The distance between the plates d is a multiple of the wavelength of F, so that the energy is additive from plate to plate. Each plate has a shape, e.g., parabolic, within a fixed focal point. The resonant frequency is proportional to a thickness of a given plate and inversely proportional to a square of a diameter of a plate ($F=(t*A)/d^2$) where A is a proportionality constant determined by the material that forms a given plate.

Figure 3:
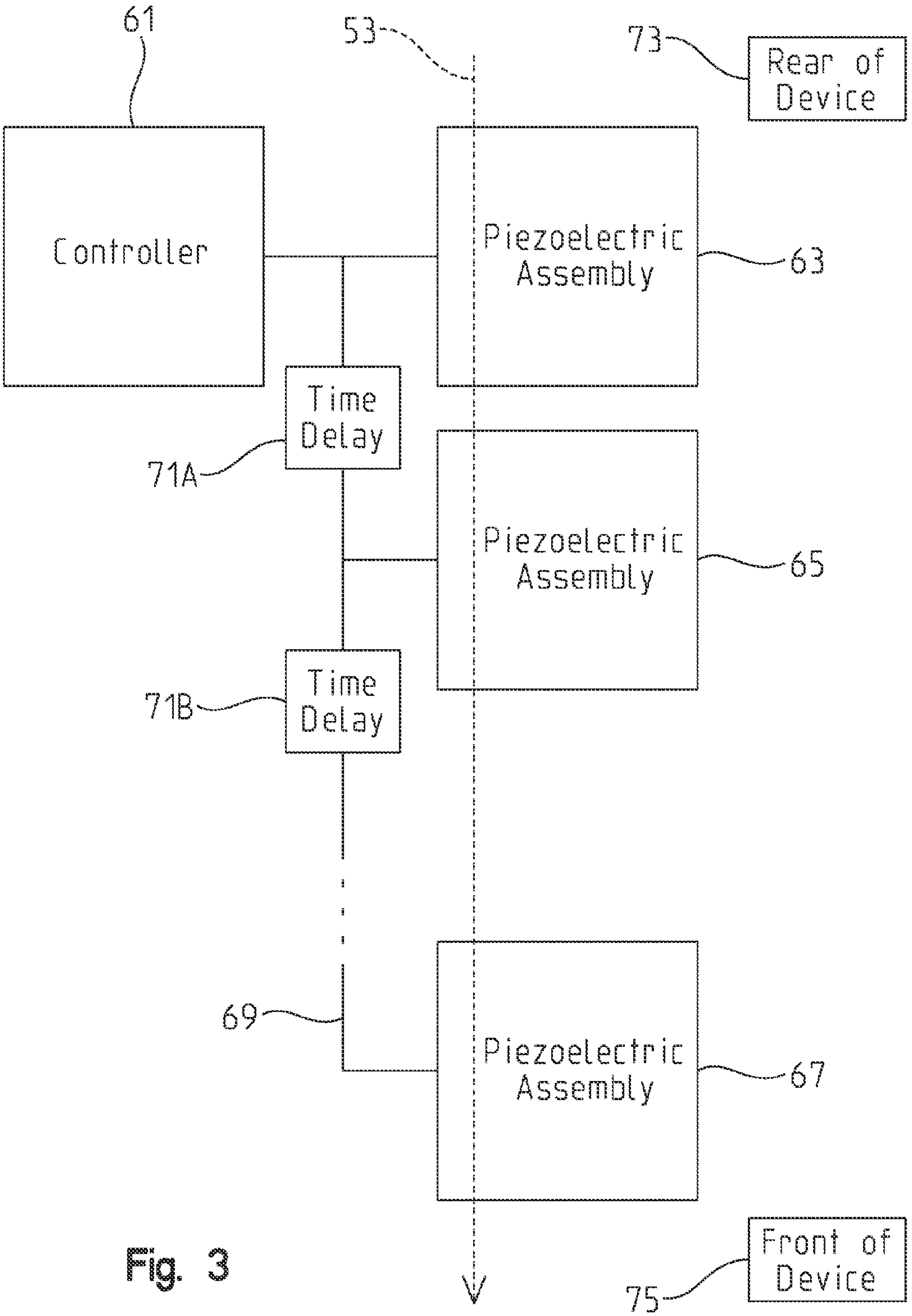
FIG. 3 shows a block diagram showing a system using the invention.

FIG. 3 shows a system which includes a controller and a piezoelectric assembly such as described herein. A controller 61 is coupled to a group of piezoelectric emitters 63, 65, 67 where the first emitter 63 (at the rear of the device 73) along the propagation path 53 is directly coupled to the controller 61 however a time delay 71A and 71B, is interposed between the controller 61 and each emitter 65, 67. A time delay can be in series or it can be inserted so that the delay is in parallel with the controller 61 depending on how the controller is adapted to drive the emitters 63, 65, 67. In this embodiment, two time delays 71A and 71B are in series with the last emitter 67 in the exemplary assembly along the propagation path 53 (i.e., the "front" of the device 75). A bus 69 connects the controller 61 with time delays 71A, 71B and emitters 63, 65, 67. Alternative embodiments can have the controller 61 couple to time delays 71A, 71B and emitters 63, 65, 67 using a variety of bus arrangements including direct connections from the controller 61 to delay circuit, to piezoelectric emitters. Such a system can be included in a variety of applications including paint removal, sonar systems, animal control devices, or other systems which use sound such as sonic or ultrasonic systems in order to produce a desired effect.

Variables affecting resonance of heat conductive plates, including metal plates, include the speed of sound in the metal, its thickness and its diameter or length and width if not circular. The speed of sound in aluminum and stainless steel are extremely close so that calculations of resonances for either produce nearly the same thicknesses and diameters, whereas for other metals such as copper, silver, etc. yield dimensions different enough to have to be calculated separately. For this example the calculations are for aluminum or stainless steel.

(Resonant) Frequency=((t=thickness of the material)*A)/(diameter$^2$) where A=(the speed of sound in the material)*(a proportionality constant) or $f=(t*A)/d^2$. For the unit dimensions in cm and frequency in hertz and the material being stainless steel or aluminum, A=791,815.5. The following table 1 illustrates calculated thickness and diameter measurements for a resonance of 10 KHz with aluminum or stainless steel.

TABLE 1

| Frequency | A | Thickness (cm) | Diameter (cm) |
|---|---|---|---|
| 10,000 | 791,815.50 | 0.1 | 2.813921641 |
| 10,000 | 791,815.50 | 0.2 | 3.979486148 |
| 10,000 | 791,815.50 | 0.3 | 4.87385525 |
| 10,000 | 791,815.50 | 0.4 | 5.627843281 |
| 10,000 | 791,815.50 | 0.5 | 6.292120072 |
| 10,000 | 791,815.50 | 0.6 | 6.892672196 |
| 10,000 | 791,815.50 | 0.7 | 7.44493687 |
| 10,000 | 791,815.50 | 0.8 | 7.958972295 |
| 10,000 | 791,815.50 | 0.9 | 8.441764922 |
| 10,000 | 791,815.50 | 1 | 8.898401542 |

Plates disposed between piezoelectric devices can be made of metal or other materials which are sonically or ultrasonically compatible with creating the effects described above. Heat and sonically/ultrasonically conductive plates, e.g., discs of steel or aluminum, can be formed or cut slightly larger than calculated as described above and then trimmed to tune the plates after the piezoelectric devices are bonded to it. Such fabrication steps can include activating the piezoelectric devices and then machining or forming the plates in order to achieve a maximum desired effect as described above. Note that references herein to the terms "sonic" and "ultrasonic" are used interchangeably herein however, it is understood that ultrasonic includes references to frequencies above human hearing ranges (e.g., above 25 kHz), sonic references include frequencies within an average human hearing range, and subsonic includes references to frequencies below an average human hearing range.

Alternative embodiments can include structures made of actuator materials which are capable of changing their shape, e.g., curvature, parabolic shape or effective diameter, based on application of electric, heat, mechanical forces, or other stimuli in order to adjust the focus or shape of the sonic or ultrasonic waves being transited through the plates. For example, the plates can be formed in layers which can slide in relation to each other to increase radius or length and width. For example, a shape memory alloy can be used in one or more plates. Shape memory alloys used herein can include copper-aluminum-nickel, and nickel-titanium (NiTi) alloys but such shape memory alloys can also be created by alloying zinc, copper, gold and iron. Electromechanical materials used herein can include metals, ceramics and carbon/carbon composite materials as well as piezoelectric and electrostrictive materials. Plates can be constructed of piezoelectric bimorphs can be configured in series and parallel. Bimorphs can be constructed of two piezoelectric plates that are bonded with their polarity in opposite directions. Under electric field one piezoelectric layer contracts in the thickness direction while the other expands. Due to the contraction and expansion in the thickness direction one layer expands along the length and the other contracts inducing bending of the bonded layers. Unimorphs are similar in configuration to bimorphs with the difference that one of the layers in passive. Under expansion in the poling direction the strain in the plane perpendicular to the poling direction undergoes a contraction such that strain occurs only on the active layer (piezoelectric or electrostrictive material) leading to a bending of the whole device. Such devices can be used to induce relatively large deflections and the amplitude increases with the lateral dimensions. Flextensional actuators, which sometimes are also known as the Moonie and Cymbal structures, use end-caps to convert transverse to longitudinal strain. Another approach used to increase the strain that can be induced with a piezoelectric material for a given field is to drive the material at its resonance frequency. Such materials can also be used to alter the interaction of sonic or ultrasonic waves passing through the plates. In general for any mechanical system it can be shown that at resonance the strain is amplified by a factor called the mechanical Q. Other embodiments can involve placing one or more actuators in mechanical coupling with a plate to induce a mechanical deflection or change in a plate's shape. Another embodiment could use piezeo, piezoelectric, piezoceramic, cryogenic shape materials, electroactive polymers or polymer-metal composites as actuator materials or other types of electromechanically active materials which change shape, volume, modulus, or some other mechanical property in response to some kind of controllable signal.

Another embodiment can include rotational coupling of the plates with the piezoelectric devices to rotate the devices and plates relative to each other while also deflecting or altering the shape of the plates in order to further provide for variable tuning of the sonic or ultrasonic structures as well as outputs, waveforms, focus points, etc.

Another embodiment can include having an acoustic lens formed within or adjacent to one or more of said plates in order to alter waveforms of sonic or ultrasonic waves passing through the plates.

Another embodiment can include a thermally conductive bonding material which bonds the plates to the piezoelectric devices. This conductive bonding material can be selected based on different refractory or other interactive effects with sonic or ultrasonic waves which pass through the material to further tune the combined wavefront of sonic or ultrasonic waves which are passing through the plates and piezoelectric devices. Different adhesives or bonding materials can be used between each different piezoelectric device in order to further alter a waveform passing through such bonding material.

Another embodiment can include injection of liquid or semiliquid material into cavities formed in the plates which alter or refract the shape of a waveform passing through the plates. Another embodiment can have mechanical substitution or rotation into or out of a stack of piezeoelectric devices which change the focus of a waveform of sonic or ultrasonic energy as such energy passes through the plates which are rotated into the assembly. Such an assembly could have a system which mechanically grips or couples with a plate, removes it from the stack, and then inserts a different plate which provides a different focus or wave front effect in order to alter energy propagation and wavefronts which are generated and focused as predetermined locations. An assembly can have a carrier or holder which holds the plates in position with a locking or unlocking mechanism which secures the plates in position until such a time a plate is selected for substitution.

Although the invention has been described in detail with reference to certain preferred embodiments, variations and modifications exist within the spirit and scope of the invention as described and defined in the following claims.

The invention claimed is:

1. An energy output apparatus assembly adapted for amplifying and controlling a plurality of piezoelectric devices comprising a plurality of piezoelectric devices;

a plurality of heat conductive structures; and a plurality of time delay devices coupled to at least some of said plurality of piezoelectric devices;

wherein said plurality of piezoelectric devices are adapted to propagate a piezoelectric effect along a propagation path, said devices comprising a front device, a back device, and intervening devices disposed between said front and back device;

wherein said plurality of heat conductive structures are thermo coupled and sonic coupled between sides of said plurality of said devices, said heat conductive structures are operable as heat sinks adapted to dissipate thermal energy from portions of said devices, each of the heat conductive structures are sized to resonate at a predetermined or an operating frequency of each of the devices a respective said heat conductive structure is coupled with on one side, said devices are stacked such as a propagation side of said devices are oriented along an axis defined by a propagation path;

wherein said assembly is adapted to produce said piezoelectric effect comprising an energy output of the devices which is directionally oriented or focused such that a phasing of each individual device produces a combined wavefront along said propagation path of said assembly that results in additive phasing of said energy output, wherein each of said time delay devices are adapted to control said energy output of said devices to further provide said additive phasing of said wavefront for each device as said energy output of the devices travels along said propagation path at or in front of the front device;

wherein each of said heat conductive structures is formed with a parabolic curvature of each structure;

wherein said each of said heat conductive structures has an increasing radius as compared to an adjacent said structure along a progression of said structures along said propagation path from said front device while each structure further has a different thickness from adjacent structures, each thickness is determined based on a thickness required to maintain its resonance so as to ensure said combined wavefront is maintained.

2. An apparatus as in claim 1, wherein said back device is sonic insulated from sonic influences outside of said assembly.

3. An apparatus as in claim 1, wherein said combined wavefront phase can be static, dynamic open or closed loop.

4. An apparatus as in claim 1, wherein structures and devices are adapted to emit directional transmission of said energy output that is focused at infinity, a point along said propagation path, or in a fan beam at an angle to said propagation path as determined by a shape of one or more said structures.

5. An apparatus as in claim 1, wherein said structures comprise round structures adapted with parabolic contours of increasing diameter along said propagation axis from said front device to said back device to provide focus of said energy output.

6. An apparatus as in claim 1, wherein said structures comprise an oval shape to provide a plurality of resonant frequencies of said energy output.

7. An apparatus as in claim 1, wherein said structures comprise a complex shape to provide multiple resonances.

8. An apparatus as in claim 1, wherein said structures comprise flat structures to provide directional transmission without focus of said energy output.

9. An apparatus as in claim 1, wherein said structures thickness is determined based on a speed of sound in a material comprising said structure, a thickness of said structure, and a diameter of said structure if said structure is circular or a length and width if said structure is not circular.

10. An apparatus as in claim 1, further comprising a controller adapted to control said devices, said controller is electrically coupled to said devices, said apparatus further comprising said structures formed with actuator materials which are adapted to change at least one part of a shape of said structures based on application of electric, heat, mechanical forces, or other stimuli in order to adjust the focus or shape sonic or ultrasonic waves being transited through the structures.

11. An apparatus as in claim 1, further comprising a housing adapted to house said assembly.

12. An apparatus as in claim 1, wherein said assembly is formed as part of an ultrasonic device.

13. An apparatus as in claim 1, wherein said devices are directionally focused.

14. An apparatus as in claim 1, wherein said structures are adapted to resonate at a predetermined said energy output of said devices.

15. An energy output apparatus comprising an assembly adapted for amplifying sonic or ultrasonic outputs from comprising a housing, controller, a plurality of piezoelectric devices, a plurality of time delay devices coupled to at least some of said plurality of piezoelectric devices, and a plurality of heat conductive structures, wherein said controller is adapted to control said devices and said time delay devices, said controller is electrically coupled to said devices;

wherein said plurality of piezoelectric devices are adapted to propagate a piezoelectric effect along a propagation path, said devices comprising a front device, a back device, and intervening devices;

wherein said plurality of heat conductive structures are thermo coupled and sonic coupled between sides of said plurality of said devices, said heat conductive structures are operable as heat sinks adapted to dissipate thermal energy from portions of said devices, each of the heat conductive structures are sized to resonate at a predetermined or an operating frequency, a heat conductive structure is coupled with of each of the devices on one side, said devices are stacked such that the propagation side of said devices are oriented along an axis defined by a propagation path;

wherein said assembly is adapted to produce said piezoelectric effect comprising an energy output of the devices which is directionally oriented or focused such that a phasing of each individual device produces a combined wavefront along said propagation path of said assembly that results in additive phasing of said energy output, wherein each of said time delay devices are adapted to control said energy output of said devices to further provide said additive phasing of said wavefront for each device as said energy output of the devices travels along said propagation path at or in front of the front device;

wherein each of said heat conductive structures are formed with a parabolic curvature of each structure;

wherein each of said heat conductive structures has an increasing radius as compared to an adjacent said structure along a progression of said structures along said propagation path from said front device while each structure further has a different thickness from adjacent structures, each thickness is determined based on a thickness required to maintain its resonance so as to ensure said combined wavefront is maintained;

wherein said back device is sonic insulated from sonic influences outside of said assembly;

wherein said combined wavefront phase can be static, dynamic open or closed loop;

wherein structures and devices are adapted to emit directional transmission of said energy output that is focused at infinity, a point along said propagation path, or in a fan beam at an angle to said propagation path as determined by a shape of one or more said structures;

wherein said structures thickness is determined based on a speed of sound in a material comprising said structure, a thickness of said structure, and a diameter of said structure if said structure is circular or a length and width if said structure is not circular;

wherein said assembly is formed as part of an ultrasonic device;

wherein said devices are directionally focused;

wherein said structures are adapted to resonate at a predetermined said energy output of said devices;

wherein said controller is electrically coupled to said devices, said apparatus further comprising said structures are formed with actuator materials which are adapted to change the shape of said structures based on application of electric, heat, mechanical forces, or other stimuli in order to adjust the focus or shape of the sonic or ultrasonic waves being transited through the structures.

16. An apparatus as in claim 15, wherein said structures comprise round structures adapted with parabolic contours of increasing diameter along said propagation axis from said front device to said back device to provide focus of said energy output.

17. An apparatus as in claim 15, wherein said structures comprise an oval shape to provide a plurality of resonant frequencies of said energy output.

18. An apparatus as in claim 15, wherein said structures comprise a shape adapted to provide multiple resonances.

19. An apparatus as in claim 15, wherein said structures comprise flat structures to provide directional transmission without focus of said energy output.

20. A method of manufacturing an energy output apparatus comprising, providing, forming, and coupling an assembly adapted for amplifying sonic or ultrasonic outputs from comprising a plurality of piezoelectric devices, a plurality of time delay devices coupled to at least some of said plurality of piezoelectric devices, and a plurality of heat conductive structures;

wherein said plurality of piezoelectric devices are adapted to propagate a piezoelectric effect from a propagation side of each said plurality of piezoelectric devices along a propagation path, said devices comprising a front device, a back device, and intervening devices;

wherein said plurality of heat conductive structures are thermo coupled and sonic coupled between sides of said plurality of said devices, said heat conductive structures are operable as heat sinks adapted to dissipate thermal energy from portions of said devices, each of the heat conductive structures are sized to resonate at a predetermined or an operating frequency of each of the devices, each respective said heat conductive structures is are coupled on one side with corresponding said devices and are stacked such that the propagation side of each said devices are oriented along an axis defined by said propagation path;

wherein said assembly is adapted to produce said piezoelectric effect comprising an energy output of the devices which is directionally oriented or focused such that a phasing of each individual device produces a combined wavefront along said propagation path of said assembly that results in additive phasing of said energy output, wherein each of said time delay devices are adapted to control said energy output of said devices to further provide said additive phasing of said wavefront for each device as said energy output of the devices travels along said propagation path at or in front of the front device;

wherein each of said heat conductive structures are formed with a parabolic curvature of each structure;

wherein said each of said heat conductive structures has an increasing radius as compared to an adjacent said structure along a progression of said structures along said propagation path from said front device while each structure further has a different thickness from adjacent structures, each thickness is determined based on a thickness required to maintain its resonance so as to ensure said combined wavefront is maintained;

wherein said structures are cut slightly larger than calculated to produce said combined wavefront along said propagation path of said assembly that is additive or in phase and then trimmed to each said structure after each said devices are bonded to a respective structure.

21. A method as in claim 20, wherein said back device is sonic insulated from sonic influences outside of said assembly.

22. A method as in claim 20, wherein said combined wavefront phase can be static, dynamic open or closed loop.

23. A method as in claim 20, wherein structures and devices are adapted to emit directional transmission of said energy output that is focused at infinity, a point along said propagation path, or in a fan beam at an angle to said propagation path as determined by a shape of one or more said structures.

24. A method as in claim 20, wherein said structures comprise round structures adapted with parabolic contours of increasing diameter along said propagation axis from said front device to said back device to provide focus of said energy output.

25. A method as in claim 20, wherein said structures comprise an oval shape to provide a plurality of resonant frequencies of said energy output.

26. A method as in claim 20, wherein said structures comprise a complex shape to provide multiple resonances.

27. A method as in claim 20, wherein said structures comprise flat structures to provide directional transmission without focus of said energy output.

28. A method as in claim 20, wherein said structures thickness is determined based on a speed of sound in a material comprising said structure, a thickness of said structure, and a diameter of said structure if said structure is circular or a length and width if said structure is not circular.

29. A method as in claim 20, further comprising providing a controller adapted to control said devices, said controller is electrically coupled to said devices.

30. A method as in claim 20, further comprising providing a housing adapted to house said assembly and deposing said assembly within said housing.

31. A method as in claim 20, wherein said assembly is formed as part of an ultrasonic device.

32. A method as in claim 20, wherein said devices are directionally focused.

33. A method as in claim 20, wherein said structures are formed and adapted to resonate at a predetermined said energy output of said devices.

34. A method of application of ultrasonic energy comprising:

providing an assembly adapted for amplifying sonic or ultrasonic outputs comprising a plurality of piezoelectric devices, a plurality of time delay devices coupled to at least some of said plurality of piezoelectric devices, and a plurality of heat conductive structures;

wherein said plurality of piezoelectric devices are adapted to propagate a piezoelectric effect from a propagation side of each said plurality of piezoelectric devices along a propagation path, said devices comprising a front device, a back device, and intervening devices disposed between said front and back device;

wherein said plurality of heat conductive structures are thermo coupled and sonic coupled between sides of said plurality of said devices, said heat conductive structures are operable as heat sinks adapted to dissipate thermal energy from portions of said devices, each of the heat conductive structures are sized to resonate at a predetermined or an operating frequency of each of the devices, each respective said heat conductive structure is coupled on one side with corresponding said devices, said devices are stacked such that the propagation side of each said devices are oriented along an axis defined by said propagation path;

wherein said assembly is adapted to produce said piezoelectric effect comprising an energy output of the devices which is directionally oriented or focused such that a phasing of each individual device produces a combined wavefront along said propagation path of said assembly that results in additive phasing of said energy output, wherein each of said time delay devices are adapted to control said energy output of said devices to further provide said additive phasing of said wavefront for each device as said energy output of the devices travels along said propagation path at or in front of the front device;

wherein each of said heat conductive structures are formed with a parabolic curvature of each structure;

wherein each of said heat conductive structures has an increasing radius as compared to an adjacent said structure along a progression of said structures along said propagation path from said front device while each structure further has a different thickness from adjacent structures, each thickness is determined based on a thickness required to maintain its resonance so as to ensure said combined wavefront is maintained;

orienting a side of said front device facing away from said back device towards a target location; and applying power to said assembly.

35. An apparatus as in claim 34, wherein said back device is sonic insulated from sonic influences outside of said assembly.

36. An apparatus as in claim 34, wherein said combined wavefront phase can be static, dynamic open or closed loop.

37. An apparatus as in claim 34, wherein structures and devices are adapted to emit directional transmission of said energy output that is focused at infinity, a point along said propagation path, or in a fan beam at an angle to said propagation path as determined by a shape of one or more said structures.

38. An apparatus as in claim 34, wherein said structures comprise round structures adapted with parabolic contours of increasing diameter along said propagation axis from said front device to said back device to provide focus of said energy output.

39. An apparatus as in claim 34, wherein said structures comprise an oval shape to provide a plurality of resonant frequencies of said energy output.

40. An apparatus as in claim 34, wherein said structures comprise a complex shape to provide multiple resonances.

41. An apparatus as in claim 34, wherein said structures comprise flat structures to provide directional transmission without focus of said energy output.

42. An apparatus as in claim 34, wherein said structures thickness is determined based on a speed of sound in a material comprising said structure, a thickness of said structure, and a diameter of said structure if said structure is circular or a length and width if said structure is not circular.

43. An apparatus as in claim 34, further comprising a controller adapted to control said devices, said controller is electrically coupled to said devices.

44. An apparatus as in claim 34, further comprising a housing adapted to house said assembly.

45. An apparatus as in claim 34, wherein said assembly is formed as part of an ultrasonic device.

46. An apparatus as in claim 34, wherein said devices are directionally focused.

47. An apparatus as in claim 34, wherein said structures are adapted to resonate at a predetermined said energy output of said devices.

* * * * *